United States Patent
Bammert et al.

(10) Patent No.: US 6,590,376 B1
(45) Date of Patent: Jul. 8, 2003

(54) METHOD OF DERIVING A FREQUENCY OF A PULSE SIGNAL FROM ALTERNATE SOURCES AND METHOD OF CALIBRATING SAME

(75) Inventors: Kurt Bammert, Lucerne (CH); Mirko Bulinsky, Lucerne (CH); Michel Schaller, Baar (CH)

(73) Assignee: Landis+Gyr AG, Zug (CH)

( * ) Notice: Subject to any disclaimer, the term of this patent is extended or adjusted under 35 U.S.C. 154(b) by 0 days.

(21) Appl. No.: 09/701,323

(22) PCT Filed: Mar. 20, 1999

(86) PCT No.: PCT/EP99/01879
§ 371 (c)(1),
(2), (4) Date: Feb. 9, 2001

(87) PCT Pub. No.: WO99/62177
PCT Pub. Date: Dec. 2, 1999

(30) Foreign Application Priority Data

May 28, 1998 (EP) .............................................. 98109712

(51) Int. Cl.$^7$ .............................................. G01R 23/14
(52) U.S. Cl. ..................................... 324/76.41; 702/79
(58) Field of Search ......................... 324/76.41, 76.47, 324/76.55, 74, 142, 110, 76.53; 702/60, 65, 75, 78, 79, 106, 107, 117, 124, 126, 183, 189, FOR 103, 104, 109, 134, 136, 170, 171

(56) References Cited

U.S. PATENT DOCUMENTS

| 3,993,984 A | 11/1976 | Penrod ................. 324/76.47 X |
| 4,902,964 A | 2/1990 | Szabela et al. .......... 324/103 P |
| 5,644,271 A | 7/1997 | Mollov et al. .............. 331/176 |
| 6,005,384 A | * 12/1999 | Hemminger et al. ........ 324/142 |

FOREIGN PATENT DOCUMENTS

| GB | 2 069 153 A | 8/1981 |
| GB | 2 132 042 A | 6/1984 |

OTHER PUBLICATIONS

"Circuit bounds output frequency", by C.R. Paul, EDN Electrical Design News, Bd. 34, No. 5, 1989.

* cited by examiner

Primary Examiner—Christine Oda
Assistant Examiner—Vincent Q. Nguyen
(74) Attorney, Agent, or Firm—Maginot, Moore & Bowman

(57) ABSTRACT

A method derives a frequency of a pulse signal from a line frequency. The method includes measuring a period of a line frequency pulse signal having the line frequency using a measured frequency derived from an oscillator frequency. The method further includes determining if the period of the line frequency pulse signal is within a predetermined tolerance limit. The line frequency is used to derive the frequency of the pulse signal when the period is determined to be within the predetermined tolerance limit, and the oscillator frequency is used to derive the frequency of the pulse signal when the period is determined to be outside the predetermined tolerance limit.

17 Claims, 4 Drawing Sheets

METHOD OF DERIVING A FREQUENCY OF A PULSE SIGNAL FROM ALTERNATE SOURCES AND METHOD OF CALIBRATING SAME

FIELD OF THE INVENTION

The invention relates to method for deriving and respectively for calibrating a frequency of a pulse signal. The method is used in electronic devices, preferably in electricity meters, supply meters, ripple-control receivers, or combinations of these devices.

BACKGROUND OF THE INVENTION

A method of the type descried hereinabove is known from U.S. Pat. No. 5,644,271 in which the compensation for frequency drift of a digital pulse signal caused by temperature is described, which pulse signal is generated by an oscillator and the frequency of which is temperature-dependant. The temperature is measured using a sensor, for example, a thermistor, the analog output signal of which in converted into a digital signal using an analog to digital converter. The digital value of the latter serves as an address to a memory in which corrective values for the frequency as a function of temperature are stored in table form. The data output of the memory is supplied via an accumulator to a delay device which, for example, is composed of a counter, the pulse input of which is supplied by a reference frequency pulse signal which is generated by a reference quartz oscillator. The counter counts the pulses of the latter. The time delay of the delay device can be adjusted digitally, in that a corrective value is loaded in parallel into the counter which then, starting with the corrective value, counts backwards to zero and on reaching the zero value generates an output pulse. The output signal of the delay device is consequently composed of temperature-dependent delayed pulses, which form the temperature-compensated pulse signal.

U.S. Pat. No. 4,902,964 is also known, in which an electricity meter with a demand register is described. Said demand register registers consumption data accumulated and stored over programmed time periods using a microprocessor. In this case knowledge of the accurate real time is of essential importance. For this purpose, a pulse signal needed for the microprocessor is derived from a 50 Hz or 60 Hz line frequency, wherein periods of a line signal are determined with the aid of a reference frequency generated using a quartz oscillator. A counter determines the line periods in that it counts the pulses of the reference frequency present between two consecutive zero crossings of the line frequency. A frequency comparator subsequently establishes whether the line period determined is a 50 Hz or a 60 Hz period, taking into account the permitted frequency tolerances, whereupon the counted value of an accompanying 50 Hz or 60 Hz counter is incremented. As soon as the counted value of one of these counters has reached the value of five, which corresponds to five zero crossings of the frequency concerned, the operating parameters of the microprocessor and of the program pulse signal are automatically established according to the line period determined.

SUMMARY OF THE INVENTION

The object of the invention is to provide a method of the type described in the introduction that makes it possible to automatically compensate for temperature and/or non-temperature-dependent undesired changes in the frequency of a pulse signal in a simple and inexpensive manner and with little complexity of circuitry, using available components where possible and without a second oscillator also being necessary. Such components already present in electricity meters, supply meters, ripple control receivers or combinations of these devices are, for example, dividers having a division factor of two.

The object described is solved in accordance with the invention by generating the frequency of the pulse signal by using the line frequency when measured periods of the line frequency pulse signal are within predetermined tolerance limits, and otherwise deriving the frequency of the pulse signal from an oscillator frequency. Advantageous embodiments of the invention are evident from the following detailed description and accompanying drawings.

An embodiment of the invention is shown in the drawings, and will be described in more detail hereinafter.

There is shown, in:

DETAILED DESCRIPTION

In many electronic devices, but above all in electricity meters, supply meters, ripple control receivers and combinations of these devices, real time, that is to say the exact calendar date and the exact time, is used. Such devices as a rule include a microprocessor 1 and a pulse generator 2 (see FIG. 1). Said pulse generator is provided with an oscillator 4 (see FIG. 2) which is preferably a quartz oscillator equipped with a quartz crystal 3. In this latter case, the pulse generator 2 is connected externally to the quartz crystal 3 (see FIG. 1) and generates for the oscillator 4 a pulse signal, the frequency of which corresponds to a quartz crystal frequency. Hereinafter, the oscillator frequency will be referenced $f_Q$ and is, for example, 32.768 kHz. A real time function is implemented as software in the microprocessor 1. The real time can be determined with a sufficient degree of accuracy with the aid of the pulse generator 2.

Figure 7:
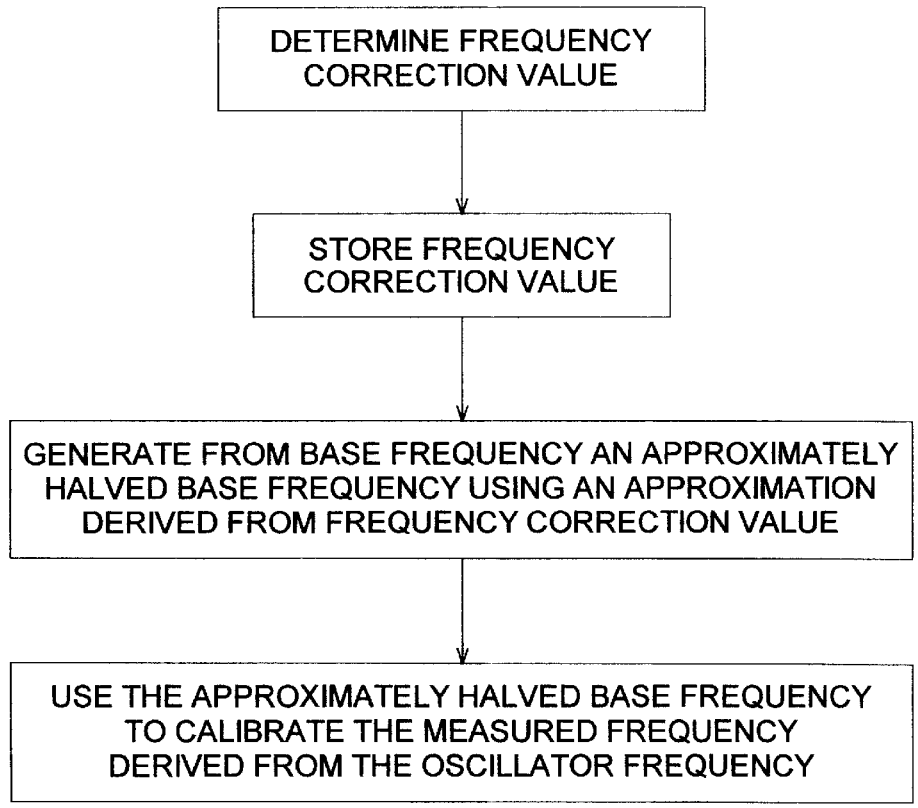

The invention will hereinafter be described in greater detail with reference to the example of an electricity meter. In modern electricity meters the exact real time at which the energy measurement took place is needed for calculation measured energy. The electricity meter includes at least one sensor HMC, not shown in the drawings, with which sensor, for example, an output $P_N$ of the measured energy is determined. The output frequency of the sensor HMC is preferable proportional to the output $p_N=u_N*i_N$, wherein $u_N$ is a line voltage of a mains energy supply, and $i_N$ is a current of the output determined. In the pulse generator 2 of the electricity meter, for example, four pulse signals CL1, CL2, CL3 and CL4 are generated (see FIG. 1). Two of these pulse signals, namely CL1 and CL2 are used by the microprocessor and each supplied via a separate connection from the pulse generator 2 to the microprocessor 1. Between the microprocessor 1 and the pulse generator 2 there is additionally a standard bidirectional SPI connection by means of which data can be transmitted synchronously in serial time in both directions between the microprocessor 1 and the pulse generator 2. The microprocessor 1 receives the pulse signal CL1, the frequency $f_T$ of which is, for example, 10 Hz, at its interrupt input. The frequency $f_T$ of the pulse signal CL1 is established by the oscillator frequency $f_Q$ of the oscillator 4 included in the pulse generator 2, or by a line frequency of $f_N$ of the mains energy supply. In the latter case, the line voltage $u_N$ of the mains energy supply supplies an input of the pulse generator and provides it with the line frequency $f_N$, which is 50 Hz in Europe and 60 Hz in the USA. The pulse signal CL1 is optionally derived from the oscillator frequency $f_Q$ for the line frequency $f_N$, for example, using an SPI command which is supplied by the microprocessor 1 via the SPI connection to the pulse generator 2. The frequencies of the three pulse signals CL2, CL3 and CL4 are, however, always derived from the oscillator frequency $f_Q$. Said frequency is, as already described, preferable a quartz oscillator frequency. The 10 Hz frequency of the pulse signal CL1 must be considered as being accurate so, except following an interruption to the voltage, no accuracy correction is necessary using microprocessor software. The pulse signal CL2 for its part forms the processor pulse of the microprocessor 1. For generating said pulse signal, the pulse generator 2 includes, for example, a phased locked loop PLL, the pulse input of which is connected to an output of the oscillator 4. With the aid of the phase locked loop PLL, based on the oscillator frequency $f_Q$, the pulse signal CL2 is generated by frequency multiplication, the frequency of which pulse signal is, for example, 150 times greater than the oscillator frequency $f_Q$, namely, for example, 5 mHz. The pulse signal CL3 supplies the sensor HMC via a separate output of the pulse generator 2. The frequency of the pulse signal CL3 serves, inter alia, as the measured frequency $f_M$. When the frequency $f_T$ of the pulse signal CL1 is derived from the line frequency $f_N$, periods $T_N$ of one of the line frequency pulse signals having the line frequency $f_N$ is measured with the aid of the measured frequency $f_M$ derived from the oscillator frequency $f_Q$, that is to say the quartz crystal oscillator frequency, in order to determine at least one period TN of the line voltage $u_N$, inter alia with the aim of effecting an automatic 50 Hz/60 Hz switchover. The frequency of the pulse signal CL3 is, for example 8.192 kHz, while that of the pulse signal CL4 is, for example, 4.096 kHz. The latter serves, inter alia, for frequency measurement of the oscillator frequency $f_Q$. The frequency of the pulse signal CL4 is in this case not calibrated, and is compare to a reference frequency $f_R$, which comparison is not shown in the drawings, in order to determine a frequency correction value m. (See FIG. 7) This frequency correction value, determined with the aid of the reference frequency $f_R$, is stored in a memory of the microprocessor 1. (See FIG. 7) The pulse signal CL4 can be measured externally via a separate output of the pulse generator 2.

Figure 2:
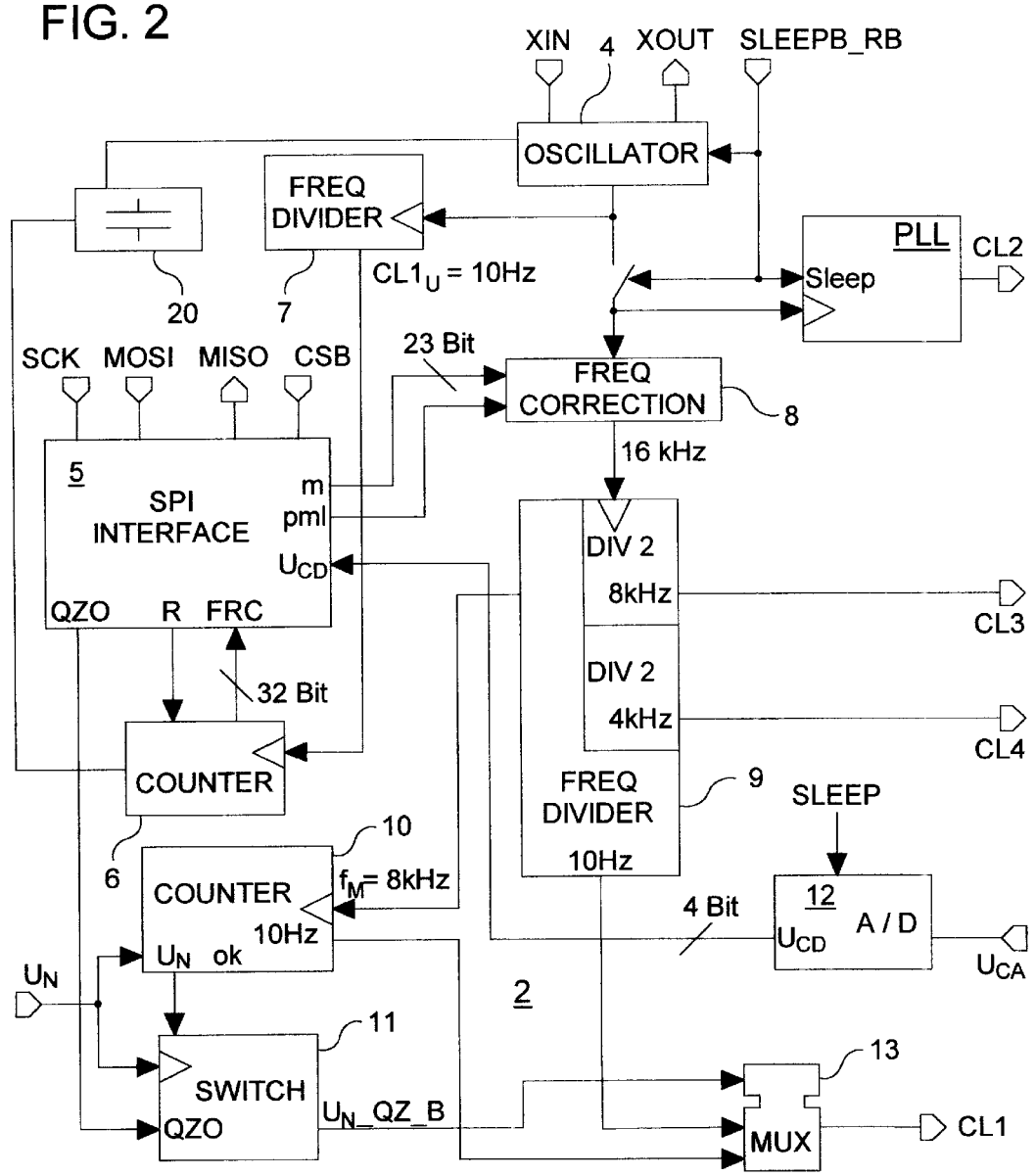
FIG. 2 a block diagram of the pulse generator.

The internal construction of the pulse generator 2 can be seen from FIG. 2. It includes, in addition to the phase locked loop PLL and the oscillator 4, an SPI interface 5, a free-running counter 6, a first frequency divider 7, a frequency correction circuit 8, a second frequency divider 9, a line frequency counter 10, a switch control circuit 11, an analog to digital converter 12, and a multiplexer 13. The quartz crystal 3, not shown in FIG. 2, is connected between two clamps XIN and XOUT of the oscillator 4, where this is a quartz crystal oscillator. The quartz crystal 3 is then preferably the only component of the oscillator 4 and of the pulse generator 2 external to the chip. All other components of said oscillator and pulse generator are integrated into a chip. The SPI interface 5 serves for communication between the microprocessor 1 and the pulse generator 2, wherein said pulse generator always operates as a slave. Using appropriate telegraphed messages, for example, functional parameters of the pulse generator 2 can be set or read, and the free-running counter 6 reset to zero. The SPI connection has four connecting wires which are respectively connected to an SCK input (shift clock), a MOSI input (master out, slave in), a CSB input (chip select) or a MISO input (master in, slave out) of the standard SPI interface 5.

The oscillator frequency $f_Q$ or respectively the frequency of the quartz crystal 3 is, as a rule, subject to relatively large variance, so the derived frequency $f_T$ of the pulse signal CL1 can be very different from device to device, and produces correspondingly inaccurate real times. It therefore has to be calibrated so that all devices produce the same real time.

In order to generate a calibrated frequency $f_G$ is used, wherein an approximation derived from the frequency correction value m is used where the base frequency $f_G$ is halved. (See FIG. 7) To do this, the base frequency $f_G$ is at least approximately halved in the frequency correction circuit 8 with the aid of a division factor $[2\pm\Delta]$, which as a rule has a small deviation $\pm\Delta$ from the ideal division factor of two. The frequency correction circuit 8 thus divides the base frequency $f_G$ by $2\pm\Delta$, that is to say by two, plus of minus a small value $\Delta$. By means of this small value $\Delta$, the error in the oscillator frequency $f_Q$ can be corrected. The value of the deviation $\pm\Delta$ is derived from the frequency correction value m. The frequency correction value m stored in the microprocessor 1 is supplied by means of an SPI telegraphed message via the SPI interface 5 to the frequency correction circuit 8. The base frequency $f_G$ is either the oscillator frequency $f_Q$, as is assumed in FIG. 2, or a frequency derived from the oscillator frequency $f_Q$. In order to obtain the calibrated pulse signal CL1, the calibrated output frequency of the frequency correction circuit 8, which is at least approximately 16.384 kHz, is used and further divided in the second frequency divider 9, namely by 1638.4 in order to obtain 10 Hz. In the second frequency divider 9 the 8.192 kHz pulse signal CL3 and the 4.096 kHz pulse signal CL4 are further generated by division of the calibrated output frequency of the frequency correction circuit 8 by two or four respectively. In FIG. 2, the digital frequency values 32,768 kHz, 16.384 kHz, 8.192 kHz and 4.096 kHz are referenced in shortened form, as in usual in digital technology, as 32 kHz, 16 kHz, 8 kHz and 4 kHz. It should be taken into consideration that when determining the frequency correction value m, an uncalibrated frequency of 4.096 kHz of the pulse signal CL4 has to be compared to the reference frequency $f_R$. This means that the frequency correction circuit 8 has in this case to divide exactly by 2, that is to say that in this case $\Delta=0$. In a production step, the pulse generator 2 can be switched with the aid of an SPI telegraphed message to a so-called calibrating mode, in order to measure an uncalibrated frequency, for example the frequency of 4.096 kHz of the pulse signal CL4 derived from the oscillator frequency $f_Q$, and to determine the frequency correction value m.

The accuracy of the oscillator frequency $f_Q$ is, for example, $\pm 20$ ppm. The accuracy of the corrected, calibrated frequency $f_T$ of the pulse signal CL1 is at least $\pm 1$ ppm.

Hereinafter, the following abbreviations will be used:

$f_Q$, $T_Q$: erroneous oscillator frequency and respectively erroneous oscillator period duration, $f_S$, $T_S$: desired frequency of oscillator and respectively desired oscillator period duration, $f_G$: base frequency, $\epsilon_Q$: relative error in the oscillator frequency, and $\epsilon_Z$: relative error in the corrected pulse frequency $f_T$.

The following relationships apply:

$$f_Q = f_S(1 \pm \epsilon_Q) \quad \text{Equation 1}$$

$$T_Q \neq \mp \epsilon_Q) \quad \text{Equation 2}$$

Figure 3:
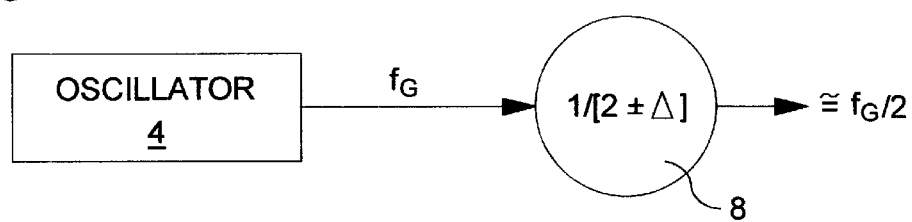
FIG. 3 an outline drawing of a frequency corrector.

As is shown in FIG. 3, the base frequency $f_G$ is divided in the frequency correction circuit 8 by $[2\pm\Delta]$ so that at the output of said circuit a pulse signal is present, the frequency of which is at least approximately $f_G/2$.

Figure 4:
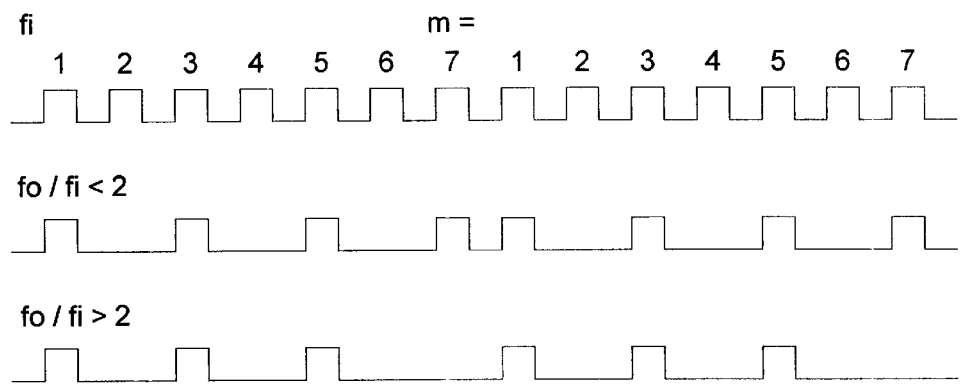
FIG. 4 pulse diagrams relating to a divider having a division factor of $2\pm\Delta$, FIG. 5a a diagram of a non-corrected system, FIG. 5b a diagram of a corrected system, FIG. 6 a flow diagram of an exemplary method of deriving a frequency of a pulse signal according to the invention, and FIG. 7 a flow diagram of an exemplary method of calibrating a measured frequency in accordance with the invention.

FIG. 4 shows the main mode of operation of a divider having a division factor of $[2\pm\Delta]$ according to the invention by means of pulse diagrams. The pulses of the base frequency $f_G$ are periodically serially numbered consecutively from one to the correction value m. The frequency correction value m is consequently a number, the value of which is a number of the pulses of the base frequency $f_G$. In order to divide by $[2\pm\Delta]$ firstly every second pulse of the base frequency $f_G$ is suppressed. The at least approximate halving of the base frequency $f_G$ consequently takes place, in that the base frequency is firstly ideally halved before a pulse is inserted or not inserted in order to effect the approximation to points in time of the pulses of the base frequency $f_G$, the number of which corresponds to the frequency correction value m to the series of pulses, the frequency of which is the ideally halved base frequency $f_G/2$. In the example shown in FIG. 4, this is the case with every seventh pulse, that is to say m=7. The deviation $\pm\Delta$ of the division factor of 2 is thus obtained in that after specific times characterised by the frequency correction value m, an additional pulse is always inserted or not inserted. Here, a pulse is always inserted when there is a negative deviation $-|\epsilon_Q|$, and no pulse is inserted when there is a positive deviation $(+|\epsilon_Q|)$ of the oscillator frequency $f_Q$ from its desired frequency. A prerequisite for a correct frequency correction in both directions $\pm\Delta$ is that the frequency correction value m is an uneven whole number. As can be seen from FIG. 4, second line, at the time of the pulse m=7, a pulse is always inserted when $f_o/f_i<2$. The other way around, when $f_o/f_i>2$, in accordance with FIG. 4, third line, at the time of the pulse m=7, no pulse is inserted. Here, $f_i$ is the number of input pulses and $f_o$ is the number of output pulses of the frequency correction circuit 8.

The division factor $[2\pm\Delta]$ realised by the frequency correction circuit 8 is produced using the formula:

$$2 \pm \Delta = \frac{f_i \text{ number of input pulses}}{f_o \text{ number of input pulses}} \frac{m}{\frac{m \mp 1}{2}} \frac{2m}{m \mp 1} \quad \text{Equation 3}$$

wherein the sign "+" is to be used when a pulse is inserted, and the sign "−" when no pulse is inserted.

The following equation is the basis for calculating the correction factor m:

$$\frac{f_S[1+\epsilon_Z]}{2} = f_S[1 \pm \epsilon_Q] \cdot \frac{m \mp 1}{2m} \quad \text{Equation 4}$$

Equation 4 solved by m produces:

$$m = \frac{|\epsilon_Q| \pm 1}{\pm \epsilon_Q - \epsilon_Z} \quad \text{Equation 5}$$

As following the frequency correction no more errors should be present, if possible, $\epsilon_Z$ should be set to equal zero. Consequently, for calculating m:

$$m = \frac{|\epsilon_Q| \pm 1}{\pm \epsilon_Q} \quad \text{Equation 5}$$

The frequency correction value m determined is supplied by the microprocessor 1 via the SPI interface 5 and the output thereof labelled m to the frequency correction circuit 8.

Equation 4 solved by $\epsilon_Z$ produces:

$$\epsilon_Z = \frac{1}{m}(\mp 1 \pm \epsilon_Q m - \epsilon_Q) \quad \text{Equation 7}$$

Calculation Example A

The accuracy of the quartz crystal is, for example, $\epsilon_Q = +101$ ppm. Equation 6 produces $$m = \frac{101 \cdot 10^{-6} + 1}{101 \cdot 10^{-6}} = 9901.99$$

or rounded up to the nearest uneven value: m=9901.

With this m value, the error after frequency correction according to equation 7 is:

$$\epsilon_Z = \frac{1}{9901}(-1 + 101 \cdot 10^{-6} \cdot 9901 - 101 \cdot 10^{-6}) = -0.01 \text{ ppm}$$

Calculation Example B

The accuracy of the quartz crystal is, for example, $\epsilon_Q = -101$ ppm. Equation 6 produces:

$$m = \frac{101 \cdot 10^{-6} - 1}{-101 \cdot 10^{-6}} = 9899.99$$

or rounded up to the nearest uneven value: m=9899.

With this m value, the error after frequency correction according to equation 7 is:

$$\epsilon_Z = \frac{1}{9899}(+1 - 101 \cdot 10^{-6} \cdot 9899 - 101 \cdot 10^{-6}) = 0.01 \text{ ppm}$$

The oscillator 4, the free-running counter 6 and the first frequency divider 7 are so-called "low power" components with a low power consumption and are supplied with a supercapacitor 20 or a battery, which exclusively supplies these three components 4, 6 and 7 during a line failure in the mains energy supply. The first frequency divider 7 divides the oscillator frequency $f_Q$ of the oscillator 4 into an uncalibrated, non-frequency-corrected frequency of a further pulse signal $CL1_U$ appearing at its output. The uncalibrated frequency of said pulse signal is, up to a calibration difference, equal to the calibrated frequency $f_T=10$ Hz of the pulse signal CL1. An oscillator frequency $f_Q$ of 32.768 kHz is thus divided by 3276.8 in the first frequency divider 7. The pulses of the pulse signal $CL1_U$ are supplied to a pulse input of the free-running counter 6, and are counted by it. The free-running counter 6 serves to keep the real time after a line interruption and is, for example, a 32 bit counter. A 32 a bit parallel output of the free-running counter 6 configured on a bus input labeled FRC (free-running counter) of the SPI interface 5. The counter status of the free-running counter 6 can be read from the SPI interface 5 and the SPI connection (see FIG. 1) by the microprocessor 1. During a line interruption, the free-running counter 6 continues counting so that its counter status is further incremented. An incremented A of the counter status of the free-running counter made during the duration of the line interruption corresponds to the duration of the line interruption. The real time is correspondingly kept in the microprocessor 1. The pulse generator 2 is set up so that a minimum operating time (running-time reserve) of one week is ensured, with the prerequisite that the capacity of an available supercapacitor is 0.56 F to 0.22 F, a parallel discharge resistor of the supercapacitor 20 is no less that 5 MΩ, and the voltage of the supercapacitor 20 at the beginning of a discharge is 5 volts. The analog value of an output voltage $U_{CA}$ of the supercapacitor 20 or respectively of the battery is converted by means of the analog-to-digital converter 12 into a digital value $U_{CD}$, which, for example has 4 bits and it supplied to an input, references $U_{CD}$ of the SPI interface 5. The analog to digitial converter 12 serves to measure the residual voltage of the supercapacitor 20 following a line interruption. The value of the residual voltage of the supercapacitor 20 is thus measured after a line interruption and requested via the SPI interface 5, by the microprocessor 1 in order to decide whether a counter status of the free-running counter 6 existing when there is a line interruption is valid or not. The three components 4, 6 and 7 function until there is a residual voltage of approximately 1 volt, and consequently continue to run when there is a line interruption for as long as the residual voltage of the supercapacitor 20 is at least 1 volt. An analog to digital conversion of the residual voltage value is initiated each time a "low power" signal on an input of the pulse generator 2 referenced SLEEPB_RB is deactivated, that is to say when a logical value "1" appears on an input referenced SLEEP of the analog to the digital converter 12 and lasts, for example, for seven oscillator pulse periods. The conversion result can be read as often as desired, and is kept until the next conversion is completed.

The periods $T_T$ of the pulse signal CL1 serve, as already described, as the time base for real time. When voltage is restored after each line interruption, the real time is kept by determining the duration of the line interruption with subsequent corresponding correction of the real time. As the determination of the duration of the outage is done with the aid of an uncalibrated pulse signal $CL1_U$, the duration determined prior to correction of the real time must be corrected by subtraction of a correction value d when there is a positive deviation $+|\epsilon_Q|$ insertion of a correction value d when there is a negative deviation $-|\epsilon_Q|$, wherein the time correction value d is dependent upon the frequency correction value m. As the free-running counter 6 has to be clocked with a 10 Hz pulse signal derived from the uncorrected quartz crystal signal, the frequency correction after a line interruption has always to be carried out by the microprocessor program. There is now the question as to by what time correction value d an incrementation A of the counter status of the free-running counter 6 has to be corrected, with a given frequency correction value m, when in the duration of a line interruption the incrementation A of the counter status of the free-running counter takes place, and its duration corresponds to the incrementation A.

Figure 5A:
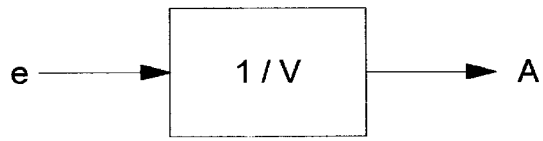

In order to arrive at an output signal of 10 Hz when there is an oscillator frequency $f_Q$ of 32.768 Hz, the division factor V of the first frequency divider 7 must equal 3276.8. The divider chain of the uncorrected system (see FIG. 5a) produces the following equation:

$$\frac{\varepsilon}{V} = A \qquad \text{Equation 8}$$

Figure 5B:
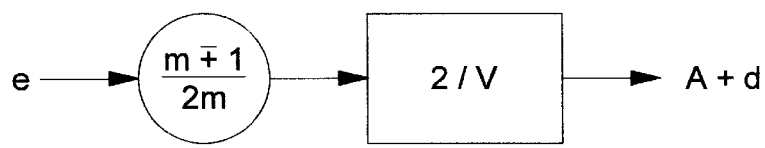

While the divider chain of the corrected system (see equation 3 and FIG. 5b) produces the equation:

$$e \cdot \frac{m \mp 1}{2m} \cdot \frac{2}{V} A \mp d \qquad \text{Equation 9}$$

By inserting equation 8 into equation 9 the result is:

$$d = \frac{A}{m} \qquad \text{Equation 10}$$

The time correction value d consequently equals a relationship A/m of the incrementation A done in the duration of the line interruption, and of the frequency correction value m, wherein the value of the relationship A/m is rounded up to the nearest whole value.

When, for example, during a voltage interruption, the free-running counter 6 was incremented by a value A=46435, then where m=9901 and $\epsilon_Q > 0$:

$$d = \frac{A}{m} = \frac{46435}{9901} = 4.69$$

or rounded up, d=5. In order to correct the inaccuracy of the oscillator frequency $f_Q$, the rounded up value d=5 must be subtracted from the increment value A of the counter status of the free-running counter 6 as $\epsilon_Q > 0$.

24 bits are preferably used for the factor m, wherein the MSB (most significant bit) provides the sign for the correction:

MSB="1": insertion of a pulse (correction for $\epsilon_Q < 0$)
MSB="0": omission of a pulse (correction for $\epsilon_Q > 0$)
The circuit functions for $3 <= m <= 2^{24} - 1$
The MSB is supplied by an output referenced pmI (plus minus pulse) of the SPI interface 5 of the frequency correction circuit 8.

A surrounding temperature T of the oscillator 4, and where present, of the quartz crystal 3 is variable as a rule, so the oscillator frequency $f_Q$ is also variable dependent on temperature. In this case, the frequency correction value m is a temperature-dependent frequency correction value $m_T$ dependent on the surrounding temperature T of the oscillator 4 or respectively of the quartz crystal 3. When a calibration takes place, when there is an average surrounding temperature $T_o$ of the oscillator 4, with the aid of the reference frequency $f_R$, an average frequency correction value $m_o$ is determined and stored. In operation, for example, continuously periodically, the surrounding temperature T of the oscillator 4 is additionally measured, and a temperature differential $\Delta T=T-T_o$ of the measured surrounding temperature T to the average surrounding temperature $T_o$ of the oscillator 4 is determined. The temperature differential $\Delta T=T-T_o$ is converted into a differential value $\Delta m$ of the frequency correction value m, which is then algebraically added to the stored average frequency correction value mo for the purpose of forming the temperature-dependent frequency correction value $m_T=m_o\pm\Delta m$, wherein the plus sign applies in the case of a positive value and the minus sign in the case of a negative value of the differential value $\Delta m$. Preferably, the measured values of the surrounding temperature T or temperature differential value $\Delta T=T-T_o$ determined of the surrounding temperature T to the average surrounding temperature $T_o$ are addresses of a memory of the microprocessor 1, in that at the corresponding address the value of the temperature-dependent frequency correction value $m_T=mo\pm\Delta m$ belonging to the address concerned is stored.

The calibrated 10 Hz pulse signal at a first output of the second frequency divider 9 and derived from the oscillator frequency $f_Q$ is supplied to a first input of the multiplexer 13. The pulse signal CL3 present at a second output of the second frequency divider 9 is supplied to a pulse input of the line frequency divider 10 and to an output, referenced CL3, of the pulse generator 2. The pulse signal CL4 present at a third output of the second frequency divider 9 is supplied to a further output, reference CL4, of the pulse generator 2.

The pulse generator 2 captures and assesses the line frequency $f_N$, wherein it is recognised whether a 50 Hz or a 60 Hz line frequency $U_N$ is present. For this purpose, the line frequency $U_N$ is supplied to an input of the line frequency counter 10, which measures its period length with the aid of the oscillator frequency $f_Q$ with the aid of the frequency correction circuit 8 and the calibrated 8.192 Hz pulse frequency of the pulse signal CL3 derived from the second frequency divider 9, which, as already described, is supplied to the pulse input of the line frequency counter 10. If there is a line period $T_N$ corresponding to 50 Hz or 60 Hz, within a tolerance limit of ±5%, a logical value "1" appears at an output, referenced $U_N\_ok$, of the line frequency counter 10, which is supplied to a control input of the switch control circuit 11. In the following table, the ±5% frequency tolerance limits of the energy supply voltage $U_N$ are given. The line frequency counter 10 counts the number of 8.192 kHz pulses of the pulse signal CL3 which are present between two consecutive positive flanks of a line frequency pulse signal, which is derived from the line frequency $U_N$ and has the frequency thereof. If, for example, 156 pulses are counted, according to the following table, the line frequency $f_N$ is within the 50 Hz ±5% frequency band and a corresponding status bit is set, which corresponds to a logical value "1" at the output $U_N\_ok$ of the line frequency counter 10.

| Number of 8.192 kHz pulses | — | 172...156 | — | 144...130 | — |
|---|---|---|---|---|---|
| Line frequency | <50 Hz − 5% | 50 Hz ± 5% | — | 60 Hz ± 5% | >60 Hz + 5% |

Figure 1:
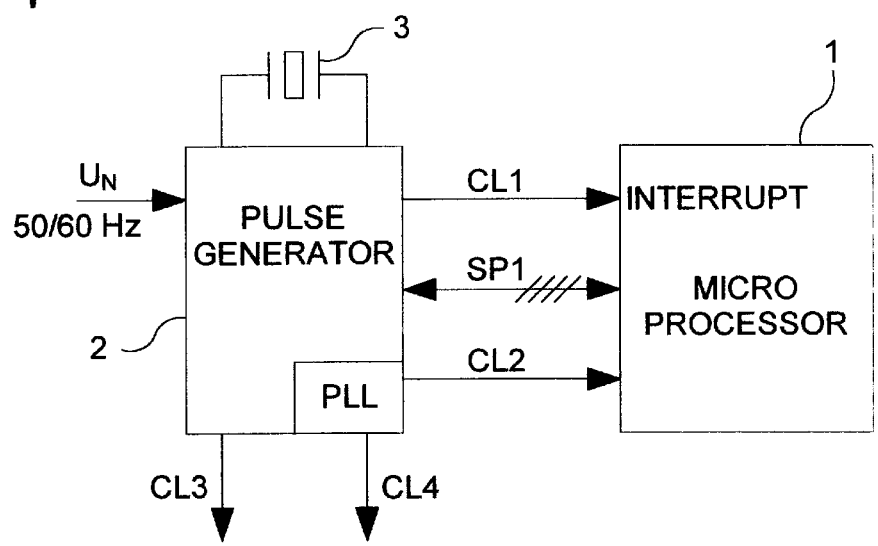
FIG. 1 a block diagram of a microprocessor connected to a pulse generator.

The line frequency $f_N$ can thus have at least two frequency values, as a rule 50 Hz and 60 Hz. By means of the measured periods $T_N$ of the line frequency pulse signal, the frequency value of the latter determines, for the purpose of selection of an associated correct division factor for deriving the desired frequency $f_T$, for example 10 Hz, of the pulse signal CL1 from the line frequency $f_N$. Within the line frequency counter 10 there are therefore two dividers, not shown, one for 50 Hz and one for 60 Hz, which in each case generate a 10 Hz pulse signal from the energy supply voltage $U_N$ or respectively the line frequency pulse signal, which appears at an output, referenced 10 Hz, of the line frequency counter 10, and is supplied to a second input of the multiplexer 13. An output signal $U_N\_QZ\_B$ at the output of the switch control circuit 11 is supplied to a control input of the multiplexer 13. With the aid of the output signal $U_N\_QZ\_B$, the first or second input of the multiplexer 13 is connected to the output thereof. The latter is at the same time an output, referenced CL1, of the pulse generator 2, which according to the drawing of FIG. 1 is connected to the interrupt input of the microprocessor 1, and on which in both cases a calibrated 10 Hz pulse signal CL1 is present. The 10 Hz frequency is then either derived from the oscillator frequency $f_Q$ or from the line frequency $f_N$, according to whether the first or the second input of the multiplexer 13 is connected.

Figure 6:
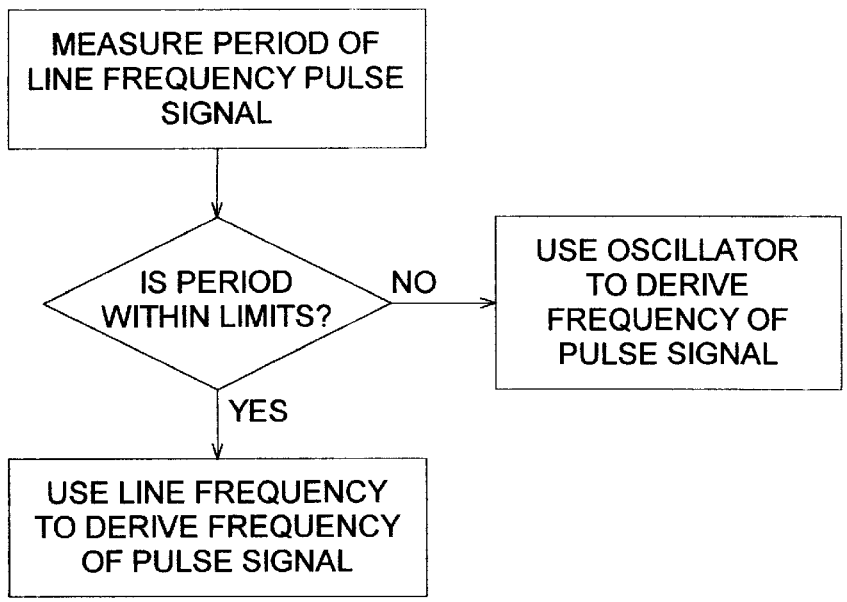

The pulse generator 2 consequently identifies two modes of operation for generating the calibrated 10 Hz pulse signal CL1 used as the microprocessor interrupt signal, wherein the mode of operation can be selected by means of an SPI telegraphed message from the microprocessor 1. By this selection, either a logical value "0" or a logical value "1" appears on an output, referenced QZO, of the SPI interface 5, which in connected to a control input QZO of the which control circuit 11. A pulse input of said circuit is supplied with the line frequency UN. In a first of the two modes of operation, the frequency $f_T$ of the pulse signal CL1 is exclusively derived from the oscillator frequency $f_Q$, which corresponds to a logical value "0" at the output QZO of the SPI interface 5. This logical value "0" generates, via the switch control circuit 11, a logical value "0" at the output $U_N\_QZ\_B$ thereof, whereby, as previously described, the first input of the multiplexer 13, at which there is the 10 Hz pulse signal derived from the oscillator frequency $f_Q$, is switched through to the output of the multiplexer 13. In the other, second, mode of operation, the frequency $f_T$ of the pulse signal CL1 is derived form the line frequency $f_N$, however, is order to generate the frequency $f_T$ of the pulse signal CL1, the line frequency $f_N$ is only used when the measured periods $T_N$ of the line frequency pulse signal are within pre-determined tolerance limits, otherwise the frequency $f_T$ of the pulse signal CL1 is derived form the oscillator frequency $f_Q$. (See FIG. 6) The measured frequency $f_M$ derived from the oscillator frequency $f_Q$ and used for measuring the periods $T_N$ is preferably calibrated in exactly the same way as the frequency $f_T$ of the pulse signal CL1, derived form the oscillator frequency $f_Q$. In order to calibrate the measured frequency $f_M$, and the frequency $f_T$ of the pulse signal CL1, preferably the same approximately halved base frequency $f_G$, already described, is used. (See FIG. 7) In the second mode of operation, a logical value "1" is present at the output QZO of the SPI interface 5. This logical value "1" generates, via the switch control circuit 11, a logical value "1" at its output $U_N\_QZ\_B$, whereby the second input of the multiplexer 13, on which the 10 Hz pulse signal derived form the line frequency $f_N$ is present, is switched through to the output of the multiplexer 13, however, only with the prerequisite that at the output, referenced $U_N\_ok$, of the line frequency counter 10, a logical value "1" is present. This latter is only the case which the line period $T_N$ is within the permitted tolerance limits. (See FIG. 6)

In the case of a line voltage $U_N$ which is too inaccurate with respect to frequency, the pulse generator 2 automatically switches over to the frequency $f_T$ derived from the oscillator frequency $f_Q$, even when a logical value "1" is present at the QZO output of the SPI interface 5 (second mode of operation), in that a logical value "0" appears at the output, referenced $U_{N\_}$ok of the line frequency counter 10, whereupon the output signal $U_{N\_}QZ\_B$ of the switch control circuit 11 assumes a logical value "0" which switches through the first input of the multiplexer 13, at which the 10 Hz pulse signal derived from the oscillator frequency $f_Q$ is present, to the output of the multiplexer 13. The switching is implemented as follows: In order to switch from the oscillator frequency $f_Q$ to the line frequency $f_N$, for example 16 consecutive line periods $T_N$ within the tolerance limits have to be measured. The other way around, the switching of the line frequency $f_N$ to the oscillator frequency $f_Q$ takes place directly after a first excessively inaccurate line period $T_N$.

What is claimed is:

1. A method for deriving a frequency of a pulse signal from a line frequency, the method comprising:
   a) measuring a period of a line frequency pulse signal having the line frequency using a measured frequency derived from an oscillator frequency;
   b) determining if the period of the line frequency pulse signal is within a predetermined tolerance limit;
   c) using the line frequency to derive the frequency of the pulse signal when the period is determined to be within the predetermined tolerance limit; and
   d) using the oscillator frequency to derive the frequency of the pulse signal when the period is determined to be outside the predetermined tolerance limit.

2. The method of claim 1 wherein step a) further comprises measuring the period of a line frequency pulse signal having the line frequency using a calibrated measured frequency derived from the oscillator frequency.

3. The method of claim 2 further comprising the steps of:
   determining a frequency correction value with the aid of a reference frequency;
   storing the frequency correction value in a memory; and wherein step a) further comprises generating an approximately halved base frequency using an approximation derived from the frequency correction value, and using the approximately halved base frequency to calibrate the measured frequency derived from the oscillator frequency.

4. The method of claim 1 wherein the line frequency has one of at least two frequency values and further comprising the steps of:
   selecting a division factor associated with the line frequency based on the measured period of the line frequency pulse signal; and
   generating the frequency of the pulse signal from the line frequency pulse signal using the division factor.

5. A method of calibrating a frequency of a pulse signal which is derived from an oscillator frequency, the method comprising:
   a) determining a frequency correction value with the aid of a reference frequency;
   b) storing the frequency correction value in a memory; and
   c) generating from a base frequency an approximately halved base frequency using an approximation derived from the frequency correction value, and using the approximately halved base frequency to generate the calibrated frequency derived from the oscillator frequency.

6. The method of claim 5 wherein:
   the base frequency is approximately halved using a division factor, the division factor including a deviation from an ideal halving division factor, the deviation based on the frequency correction value.

7. The method of claim 5 wherein the base frequency is derived from the oscillator frequency.

8. The method of claim 5 wherein:
   the frequency correction value is an uneven whole number;
   the base frequency is halved; and
   a pulse is inserted into the pulse signal when a number of pulses of the base frequency reaches the frequency correction value and when a negative deviation between the oscillator frequency and a desired frequency exists.

9. The method of claim 5 wherein
   periods of the pulse signal serve as a time basis for a real time clock;
   determining a duration of a line interruption and correcting the real time clock based on the duration, said determination based on an uncalibrated pulse signal and a correction value, the correction value based on the frequency correction value.

10. The method of claim 9 further comprising:
    using a frequency divider to divide the oscillator frequency of an oscillator into a subsequent uncalibrated pulse signal, the further subsequent uncalibrated pulse signal having the frequency of the pulse signal up to a calibrating difference;
    counting the subsequent uncalibrated pulse signal using a free-running counter having a counter status, an incrementation A of the counter status of the free-running counter corresponding to the duration of the line interruption.

11. The method of claim 10 wherein the oscillator, the frequency divider and the free-running counter obtain power from a supercapacitor during a line interruption.

12. The method of claim 11, further comprising
    measuring a residual voltage of the supercapacitor after a line interruption; and
    determining whether the counter status of the free running counter is valid based on the residual voltage.

13. The method of claim 10 wherein the oscillator, the frequency divider and the free-running counter obtain power from a battery during a line interruption.

14. The method of claim 5 wherein step a) further comprises varying the frequency correction value depending upon a surrounding temperature of the oscillator.

15. The method of claim 14 wherein step a) further comprises:
    determining an average frequency correction value for an average surrounding temperature;
    measuring the surrounding temperature of the oscillator;
    determining a temperature differential between the average surrounding temperature and the measured surrounding temperature;
    converting the temperature differential to a differential value of the frequency correction value;
    combine the average frequency correction value with the differential value of the frequency correction value to obtain the frequency correction value.

16. The method of claim 15, wherein:
    an address in a memory of the microprocessor is defined by at least one of the measured surrounding temperature and the determined temperature differential; and the address in memory stores the value of the frequency correction value corresponding to the at least one of the measured surrounding temperature and the determined temperature differential.

17. A method for deriving a frequency of a pulse signal from a line frequency, the method comprising:

a) measuring a period of a line frequency pulse signal having the line frequency using a measured frequency derived from an oscillator frequency, said measuring performed within at least one of a group consisting of an electricity meter, a supply meter, and a ripple control meter.

b) determining if the period of the line frequency pulse signal is within a predetermined tolerance limit;

c) using the line frequency to derive the frequency of the pulse signal when the period is determined to be within the predetermined tolerance limit; and d) using the oscillator frequency to derive the frequency of the pulse signal when the period is determined to be outside the predetermined tolerance limit.

* * * * *